(12) United States Patent
Berthelon et al.

(10) Patent No.: US 12,167,703 B2
(45) Date of Patent: Dec. 10, 2024

(54) ELECTRONIC CHIP WITH TWO PHASE CHANGE MEMORIES

(71) Applicant: STMicroelectronics (Crolles 2) SAS, Crolles (FR)

(72) Inventors: Remy Berthelon, Crolles (FR); Franck Arnaud, St Nazaire les Eymes (FR)

(73) Assignee: STMicroelectronics (Crolles 2) SAS, Crolles (FR)

(*) Notice: Subject to any disclaimer, the term of this patent is extended or adjusted under 35 U.S.C. 154(b) by 0 days.

(21) Appl. No.: 18/321,347

(22) Filed: May 22, 2023

(65) Prior Publication Data

US 2023/0309423 A1 Sep. 28, 2023

Related U.S. Application Data

(62) Division of application No. 17/216,193, filed on Mar. 29, 2021, now Pat. No. 11,690,303.

(30) Foreign Application Priority Data

Mar. 30, 2020 (FR) ...................... 2003106

(51) Int. Cl.
*G11C 11/00* (2006.01)
*H10B 63/00* (2023.01)
*H10N 70/00* (2023.01)
*H10N 70/20* (2023.01)

(52) U.S. Cl.
CPC .......... *H10N 70/231* (2023.02); *H10B 63/00* (2023.02); *H10N 70/021* (2023.02); *H10N 70/063* (2023.02); *H10N 70/8828* (2023.02)

(58) Field of Classification Search
CPC ............. H10N 70/231; H10N 70/8828; H10N 70/021; H10N 70/063; H10B 63/00
USPC ........................................... 365/163
See application file for complete search history.

(56) References Cited

U.S. PATENT DOCUMENTS

| 7,558,100 | B2 | 7/2009 | Ahn et al. | |
|---|---|---|---|---|
| 7,919,768 | B2* | 4/2011 | Chen | H10N 70/231 257/3 |
| 8,030,128 | B1* | 10/2011 | Sutardja | H10N 70/068 257/E47.001 |
| 8,426,840 | B2* | 4/2013 | An | H10B 63/30 257/4 |

(Continued)

FOREIGN PATENT DOCUMENTS

| CN | 101106175 A | 1/2008 |
|---|---|---|
| CN | 106299112 A | 1/2017 |
| EP | 2615611 A2 | 7/2013 |

*Primary Examiner* — Viet Q Nguyen
(74) *Attorney, Agent, or Firm* — Seed IP Law Group LLP (57) ABSTRACT

An electronic chip includes at least a first array of first elementary cells and a second array of second elementary cells. The first and second elementary cells form two types of phase change memory having a storage element formed by a volume of phase change material having either a crystalline state or an amorphous state depending on the bit stored. Each first elementary cell includes a volume of a first phase change material, and each second elementary cell includes a volume of a second phase change material that is different from the first material. Each elementary cell includes a heating connector configured for the passage of a heating current adapted to cause a phase change of the volume of phase change material of the elementary cell.

17 Claims, 9 Drawing Sheets

(56) References Cited

U.S. PATENT DOCUMENTS

| | | | | |
|---|---|---|---|---|
| 8,552,412 | B2* | 10/2013 | Park | H10N 70/011 |
| | | | | 257/E45.001 |
| 8,822,969 | B2* | 9/2014 | Hwang | H10N 70/8828 |
| | | | | 257/4 |
| 8,871,559 | B2* | 10/2014 | Horii | H10N 70/066 |
| | | | | 438/95 |
| 8,875,559 | B2* | 11/2014 | Bossard | G01N 1/4005 |
| | | | | 95/55 |
| 9,090,440 | B2* | 7/2015 | Lambert | B66F 3/08 |
| 9,106,827 | B2* | 8/2015 | Fukuda | H04N 23/672 |
| 9,190,610 | B2 | 11/2015 | Liang et al. | |
| 9,227,378 | B2 | 1/2016 | Colombo et al. | |
| 9,691,475 | B2 | 6/2017 | Redaelli | |
| 9,716,129 | B1* | 7/2017 | Sim | H10N 70/231 |
| 9,735,354 | B2* | 8/2017 | Redaelli | H10B 63/32 |
| 9,971,471 | B2* | 5/2018 | Haynes | G06F 3/167 |
| 10,256,190 | B2 | 4/2019 | Lee et al. | |
| 10,522,595 | B2* | 12/2019 | Terai | H10N 70/826 |
| 10,566,386 | B2* | 2/2020 | Jeong | H10N 70/8836 |
| 10,608,176 | B2* | 3/2020 | Terai | H10N 70/8265 |
| 10,854,673 | B2* | 12/2020 | Navarro | H10N 70/231 |
| 10,903,423 | B2* | 1/2021 | Morin | H10B 63/82 |
| 11,069,746 | B2 | 7/2021 | Yoo | |
| 11,205,682 | B2* | 12/2021 | Wu | H10B 63/80 |
| 11,653,582 | B2* | 5/2023 | Arnaud | H10B 63/80 |
| | | | | 257/4 |
| 2004/0042298 | A1 | 3/2004 | Hideki | |
| 2007/0034905 | A1 | 2/2007 | Elkins | |
| 2007/0290185 | A1* | 12/2007 | Wang | H10N 70/231 |
| | | | | 257/3 |
| 2008/0068879 | A1 | 3/2008 | Ahn et al. | |
| 2008/0248632 | A1 | 10/2008 | Youn et al. | |
| 2010/0012915 | A1 | 1/2010 | Yoon et al. | |
| 2010/0327251 | A1* | 12/2010 | Park | H10N 70/231 |
| | | | | 257/E47.001 |
| 2011/0300684 | A1 | 12/2011 | Choi et al. | |
| 2011/0300685 | A1* | 12/2011 | Horii | H10N 70/8265 |
| | | | | 257/E21.09 |
| 2013/0040408 | A1* | 2/2013 | Nam | H10B 61/22 |
| | | | | 438/238 |
| 2013/0181183 | A1 | 7/2013 | Pellizzer et al. | |
| 2015/0188040 | A1* | 7/2015 | Zanderighi | H10B 63/32 |
| | | | | 257/5 |
| 2016/0072059 | A1 | 3/2016 | Kim et al. | |
| 2018/0005786 | A1 | 1/2018 | Navarro et al. | |
| 2018/0374898 | A1* | 12/2018 | Gourvest | H10B 63/82 |
| 2019/0123277 | A1* | 4/2019 | Jeong | H10N 70/8413 |
| 2019/0252464 | A1 | 8/2019 | Terai | |

\* cited by examiner

ELECTRONIC CHIP WITH TWO PHASE CHANGE MEMORIES

BACKGROUND

Technical Field

The present description relates to the field of electronic chips, and more precisely to an electronic chip with two phase change memories, and the manufacturing method thereof.

Description of the Related Art

An electronic chip, also called integrated circuit, comprises several electronic components on semiconductor.

For example, short-term memory and long-term memory are distinguished. A short-term memory is a computer memory in which may be stored, then deleted, data processed by the processor. It is mainly characterized by its rapidity of access (in reading/writing), essential for rapidly supplying data to the processor. The short-term memory is generally volatile in that the data that are stored therein are lost if powered off. Certain short-term memories may however be non-volatile, although with generally longer access times. In most cases, the short-term memory does not need to have an important retention capacity since the data stored in the memory are often modified. On account of the rapidity requirements needed by functions such as a processor cache (between, several nanoseconds or hundreds of nanoseconds), a short-term memory is generally a random-access memory (RAM) with an architecture based on transistors. For example, the static random-access memory (SRAM) is a type of random-access memory using latches to memorize data, an elementary cell of which may comprise up to six transistors (at least four forming two cross-coupled inverters), whereas a dynamic random-access memory (DRAM) cell generally comprises a capacitor and an access transistor.

A long-term memory is a large capacity memory, non-volatile, intended to store information in the long term (typically several years). In exchange for this retention requirement, a long-term memory may have access times substantially longer than those of a short-term memory, since the data that are stored therein are less used (they are otherwise cached in a volatile memory). For example, an electronic chip may have flash memory modules as non-volatile memory, wherein the data are stored in a MOS transistor by means of the trapping of electrons by a floating gate embedded in the middle of the gate oxide, between the channel and the gate.

Although these architectures have several advantages, and notably very short access times, they also have notable drawbacks. An important drawback stems from the significant bulk induced by their structures, which limits the maximum density that can be obtained. Yet, a high memory density is particularly useful because high density makes it possible to increase the amount of memory without additional semiconductor consumption. Moreover, high memory density also makes it possible to obtain better performances. The density of short-term memories has until now continually increased by reducing the size of the components of these memories, but this approach has limits, both technological and economic.

A constraint induced by the manufacture of the memory is that the manufacturing method should make it possible to manufacture, on a same integrated circuit and with compatible manufacturing steps, short-term memories and long-term memories with different characteristics, notably access times. This constraint has until now limited attempts to increase memory density other than by the reduction of the size of the memory cells, without modification of their structures.

BRIEF SUMMARY

There exists a need to be able to accommodate together, on a same electronic chip, memories having different characteristics while exceeding the memory density limits of short-term memories.

To this end, an electronic chip is proposed herein comprising at least a first array of first elementary cells and a second array of second elementary cells, each elementary cell each storing at least one data bit in a storage element having a state dependent on the bit stored, the two arrays of elementary cells forming two types of phase change memory wherein the storage element is formed by a volume of phase change material configured to have either a crystalline state or an amorphous state depending on the bit stored, each first elementary cell comprising a volume of a first material, and each second elementary cell comprising a volume of a second material, different from the first material, the second material having either a crystalline state or an amorphous state depending on the bit stored, each elementary cell comprising a heating connector configured for the passage of a heating current adapted to cause a phase change of the volume of phase change material of said elementary cell.

The electronic chip is advantageously completed by the following different features taken alone or according to all possible combinations thereof:
- the second material has a melting temperature less than a melting temperature of the first material by at least 50° C., preferably less than the melting temperature of the first material by at least 80° C., and further preferably less than the melting temperature of the first material by at least 120° C.;
- the first material and the second material are chalcogenides, and preferably are ternary chalcogenide compounds;
- the first phase change material and the second phase change material are made of germanium-antimony-tellurium, the first material having a germanium content at least three times greater than that of the second material, and the second material having an antimony content at least three times greater than that of the first material;
- the first material is made of germanium-antimony-tellurium with a germanium content greater than 60%, and the second material is made of germanium-antimony-tellurium with an antimony content greater than 60%;
- the storage element of a first elementary cell is constituted by the volume of first phase change material, and the storage element of a second elementary cell comprises the volume of second phase change material; and
- the volume of second phase change material of a second elementary cell corresponds to a lower heating connector in contact with a metal contact traversing an insulating layer.

The disclosure also relates to a method for manufacturing an electronic chip according to the disclosure, comprising:
  a) providing a starter of an electronic chip comprising a plurality of metal contacts traversing a first insulating layer, a first zone of the electronic chip corresponding to the first elementary cells to produce and a second zone of the electronic chip corresponding to the second elementary cells to produce;

b) the production on the first insulating layer of lower heating connectors traversing an intermediate layer adapted to connect at least the metal contacts of the first zone, spacers being interposed between adjacent lower heating connectors;

c) the successive depositions of the two phase change materials, the first material being deposited on the intermediate layer in contact with the lower heating connectors, and upper conductors being formed above the first material by the deposition of a second conductive layer, whereas the second material is deposited following the production of at least one space etched beforehand in a second zone corresponding to the second elementary cells using a first etching mask having an opening facing said second zone, the second material being deposited in this space etched beforehand, the second material being later removed from at least the first zone;

d) separation etching of the first elementary cells and second elementary cells; and e) formation of insulating layers between the first elementary cells and the second elementary cells, and metallization forming conductive lines connecting the upper conductors of the first elementary cells and the second elementary cells.

Step c) may comprise the following sub-steps:

c1) deposition of the first material on the intermediate layer in contact with the lower heating connectors;

c2) deposition of a conductive layer on the first material, intended to form upper conductors for the first elementary cells;

c3) putting in place the first etching mask having an opening facing the second zone, and etching the conductive layer and the first material to produce the space etched beforehand at the second zone;

c4) deposition of the second material at the first zone and the second zone, the second material being, in the second zone, in contact with the lower heating connectors, and deposition of a conductive layer on the second material, intended to form upper connectors for the second elementary cells; and c5) putting in place a second etching mask covering a space of the second zone and leaving free the first zone, and removal of the second material from the first zone.

During step b), the lower heating connectors may be in contact with the metal contacts of the first zone and the second zone.

Step c) may comprise the following sub-steps:

c1') putting in place the first etching mask having an opening uncovering the second zone, and etching the intermediate layer down to the first insulating layer;

c2') deposition of the second material, said second material being in contact with metal contacts of the second zone;

c3') removal of the second material from the first zone to free the intermediate layer; and c4') deposition of the first material at the first zone and the second zone and deposition of a conductive layer on the first material, intended to form upper conductors.

During step b), the lower heating connectors are then in contact with the metal contacts of the first zone only.

BRIEF DESCRIPTION OF THE SEVERAL VIEWS OF THE DRAWINGS

Other characteristics, aims and advantages of the method will become clear from the description that follows, which is purely illustrative and non-limiting, and which should be read with regard to the appended drawings, in which.

DETAILED DESCRIPTION

Figure 1:
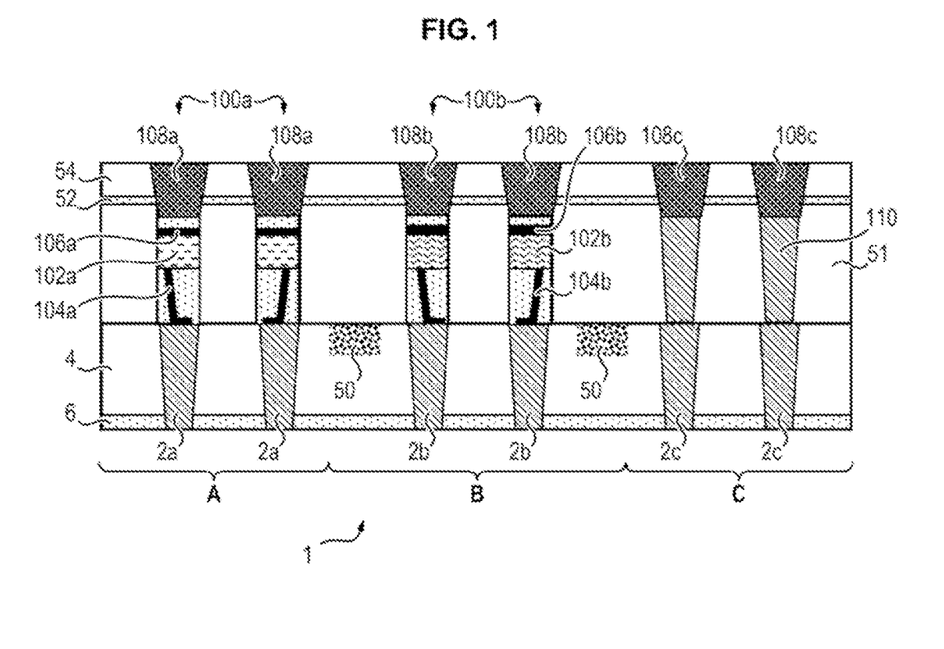
FIG. 1 shows an electronic chip resulting from the first manufacturing method according to an embodiment of the disclosure.
Figure 11:
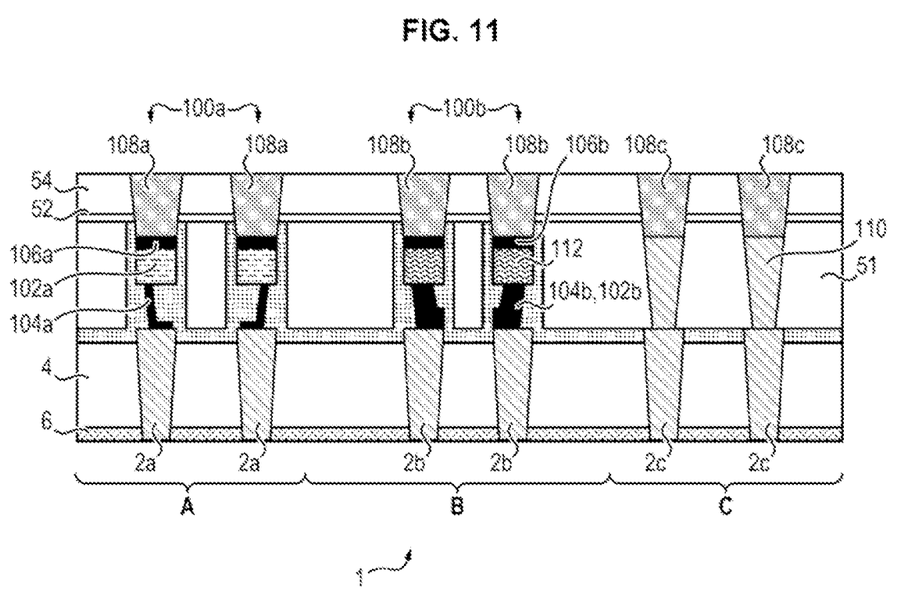
FIG. 11 shows the electronic chip resulting from the second manufacturing method according to an embodiment of the disclosure.

With reference to FIGS. 1 and 11, an electronic chip comprises at least a first array of first elementary cells 100a and a second array of second elementary cells 100b, each elementary cell 100a, 100b each being configured to store at least one data bit in a storage element having a state dependent on the bit stored. The first elementary cells 100a are situated in a first zone A of the electronic chip, whereas the second elementary cells 100b are situated in a second zone B of the electronic chip.

The two arrays of elementary cells 100a, 100b form two types of phase change memory wherein the storage element is formed by a volume 102a, 102b of phase change material having either a crystalline state or an amorphous state depending on the bit stored. Each first elementary cell 100a comprises a volume 102a of a first material, and each second elementary cell 100b comprises a volume 102b of a second material, different from the first material. The second material may have a melting temperature less than the melting temperature of the first material by at least 50° C., and preferably less than that of the first material by at least 80° C., and further preferably less than that of the first material by at least 120° C. Preferably, the first phase change material is a chalcogenide, and further preferably is a ternary chalcogenide compound. Preferably, the first material has a germanium content at least three times greater than that of the second material, and the second material having an antimony content at least three times greater than that of the first material. In particular, the first material may be made of germanium-antimony-tellurium (GeSbTe), with a majority content of germanium, greater than 60%, and preferably greater than 70%, and further preferably at least 80%. Preferably, the second material is a chalcogenide, and further preferably is a ternary chalcogenide compound. In particular, the second material may be made of germanium-antimony-tellurium (GeSbTe), with a majority content of antimony, greater than 60%, and preferably greater than 70%, and further preferably at least 80%.

In embodiments such as those illustrated by FIGS. 1 and 11, a first cell 100a comprises, above a metal contact 2a, a volume 102a of first phase change material surrounded by a lower heating connector 104a and by an upper conductor 106a. In this first elementary cell 100a, the storage element having either a crystalline state or an amorphous state depending on the bit stored is constituted by the volume 102a of first phase change material.

In an embodiment such as that illustrated by FIG. 1, a second cell 100b comprises, above a metal contact 2b, a volume 102b of second phase change material surrounded by a lower heating connector 104b and by an upper conductor 106b. In this second elementary cell 100b, the storage element having either a crystalline state or an amorphous state depending on the bit stored is constituted by the volume 102b of second phase change material.

In an embodiment such as that illustrated by FIG. 11, a second cell 100b comprises, above a metal contact 2b, a volume 102b of second phase change material forming lower heating connector 104b, with above a volume 112 of first phase change material surmounted by an upper conductor 106b. In this second elementary cell 100b, the storage element having either a crystalline state or an amorphous state depending on the bit stored comprises at least the volume 102b of second phase change material forming lower heating connector 104b, and optionally also the volume 112 of first phase change material.

Several methods for manufacturing an electronic chip comprising at least a first array of first elementary cells and a second array of elementary cells forming two types of phase change memory will now be described. In the description that follows, the term etching is employed in the wide sense, to designate the removal of one or more layers of materials on the surface of the wafer. The etching may be wet or dry, and may for example be implemented within a photolithography method, and may thus correspond to methods such as patterning.

First Manufacturing Method

Figure 2:
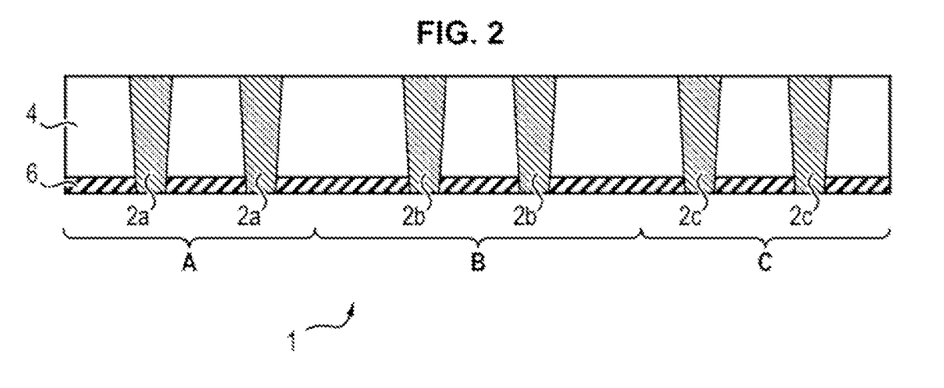
FIG. 2 shows a step of a first method for manufacturing an electronic chip according to an embodiment of the disclosure.

With reference to FIGS. 1 to 10, a first manufacturing method makes it possible to obtain such an electronic chip. A first step of the method comprises providing a starter 1 of an electronic chip from a front end of line portion (FEOL), which is illustrated by FIG. 2. In order to simplify the description, only the parts of the manufacture corresponding to the manufacture of the first array of elementary cells and the second array of elementary cells forming two types of phase change memory will be dealt with here. The other parts (processors, other memories, field effect transistors, etc.) are neither represented in the figures, nor detailed herein, even though they are also present during manufacture.

In the present case, the starter 1 thus has on the surface of a substrate devices such as transistors and selectors which form a part of the logic of memories. This part is not represented in the figures, in so far as it involves a part known to those skilled in the art, not impacted by the disclosure. Preferably, the substrate is formed of silicon on insulator. The starter 1 comprises a plurality of metal contacts 2a, 2b, 2c (for example made of tungsten) traversing a first insulating layer 4, for example made of $SiO_2$, which may be formed on the surface of a passivation layer 6, for example made of silicon nitride.

The electronic chip, and thus its starter 1, may be divided into several spatial zones each corresponding to emplacements where components of the chip are intended to be produced. In the example illustrated, a first zone A of the electronic chip corresponds to the first elementary cells to produce, a second zone B corresponds to the second elementary cells to produce, and a third zone C corresponds to connections between the levels of the electronic chip. For reasons of simplification, the first zone A is shown adjacent to the second zone B. Other zones could however separate them. In addition, there could be several first zones A and several second zones B therein, each intended to receive a memory array. The third zone C is present to show an example of compatibility of the manufacturing method with the production of other components, but this third zone C and its characteristics are optional, and will sometimes be omitted.

The metal contacts 2a, 2b, 2c are regularly spread out in the first insulating layer 4 and traverse both the first insulating layer 4 and the first passivation layer 6. The metal contacts 2a, 2b, 2c are flush on the surface of the first insulating layer 4. In order to simplify things, only two contacts per zone are illustrated in the sections appearing in the figures, but it is understood that in reality many more (sometimes hundreds and more generally thousands) of metal contacts 2a, 2b are aligned at least for the first zone A and the second zone B, since each array of elementary cells typically comprises several thousands or millions of elementary cells.

On the starter 1 of the electronic chip, and notably on the first insulating layer 4, are produced lower heating connectors traversing a passivation layer, preferably made of silicon nitride, to connect at least the metal contacts 2a of the first zone A, and in this embodiment also connecting the metal contacts 2b of the second zone B and the metal contacts 2c of the third zone C. These lower heating connectors will serve to circulate the heating current and to heat up by Joule effect.

Figure 3:
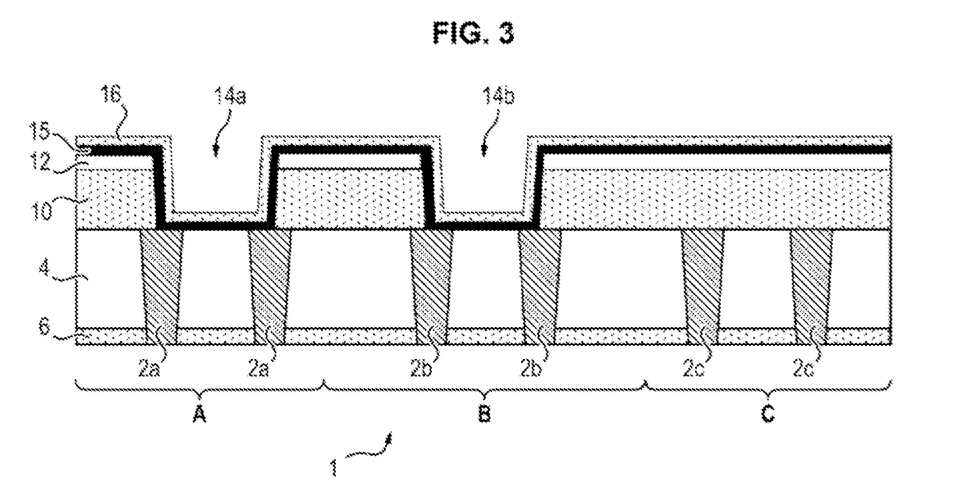
FIG. 3 shows a step of the first method for manufacturing an electronic chip according to an embodiment of the disclosure, which follows FIG. 2.

To do so, as illustrated in FIG. 3, an intermediate layer 10, preferably made of silicon nitride, is arranged on the surface of the first insulating layer 4, covering the metal contacts 2a, 2b, 2c which are flush therewith. A second insulating layer 12, typically made of silicon dioxide, is next deposited on the intermediate layer 10. By means of an initial etching mask having an opening at the first zone A and an opening at the second zone B, trenches 14a, 14b are arranged by etching until reaching the first insulating layer 4 and to free at least partially each metal contact 2a, 2b of the first zone A and the second zone B. In the example illustrated, each trench 14a, 14b straddles two metal contacts 2a, 2b, and thus makes it possible to free two metal contacts 2a, 2b at the same time. Preferably, the walls of the trenches 14a, 14b are above the metal contacts 2a, 2b of the first zone A and the second zone B.

A first conductive layer 15 is next deposited, for example made of titanium nitride or titanium nitride-silicon. This first conductive layer 15 is intended to form lower heating conductors. Like the other layers, this first conductive layer 15 covers the whole of the starter 1, and thus covers the second insulating layer 12 for the non-etched zones, for the etched zones covers the first insulating layer 4 on the surface of which are flush the metal contacts 2a, 2b of the first zone A and the second zone B, in the trenches 14a, 14b. On this first conductive layer 15 may be deposited a second passivation layer 16, for example made of silicon nitride. When the walls of the trenches 14a, 14b are above the metal contacts 2a, 2b, the conductive layer 15 that covers them also stands above the metal contacts 2a, 2b.

The formation of spacers 18a, 18b in the trenches 14a, 14b is next carried out, between adjacent lower heating connectors 104a, 104b formed from the first conductive layer 15, right above two adjacent metal contacts 2a, 2b. To do so, an etching is for example carried out removing the second passivation layer 16 at least in the trenches 14a, 14b. An additional deposition of silicon nitride may take place, then another etching at least in the trenches 14a, 14b. Thus, the conductive layer 15 on the surface of the first insulating layer 4 between two adjacent metal contacts 2a, 2b is removed. Insulating spacers 18a, 18b, for example made of silicon dioxide $SiO_2$, may next be arranged to fill the spaces thus freed from the trenches 14a, 14b.

Figure 4:
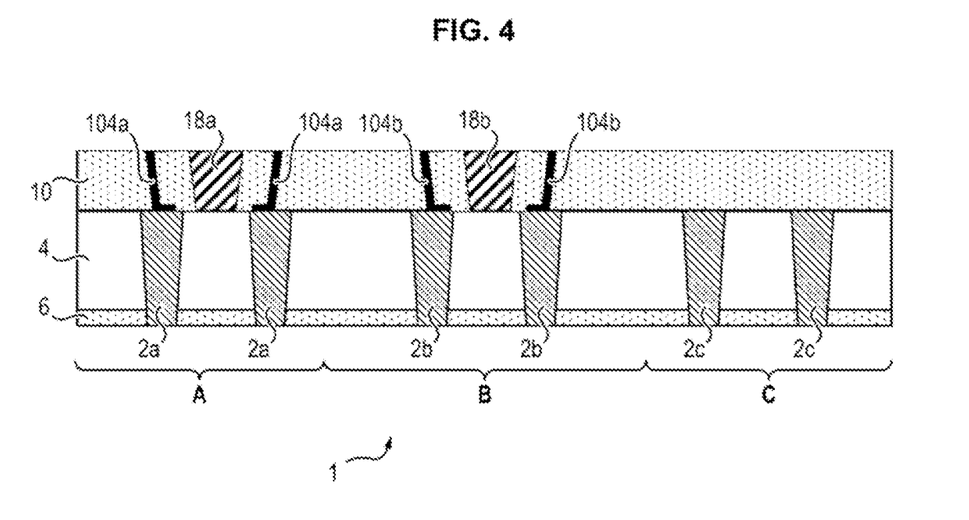
FIG. 4 shows a step of the first method for manufacturing an electronic chip according to an embodiment of the disclosure, which follows FIG. 3.

The parts above the intermediate layer 10 are next removed to flatten the starter 1, for example by chemical mechanical planarization, at the level of the surface of the intermediate layer 10. Whereas the second insulating layer 12 is thus entirely removed, the parts of the conductive layer 15 and the second passivation layer 16 which penetrate into the trenches 14a, 14b below the surface of the intermediate layer 10, are conserved, as well as the spacers 18a, 18b. The starter 1 of FIG. 4 is then obtained. The conserved parts of the conductive layer 15 form the lower heating connectors 104a, 104b, and spacers 18a, 18b are interposed between adjacent lower heating connectors 104a, 104b.

Figure 5:
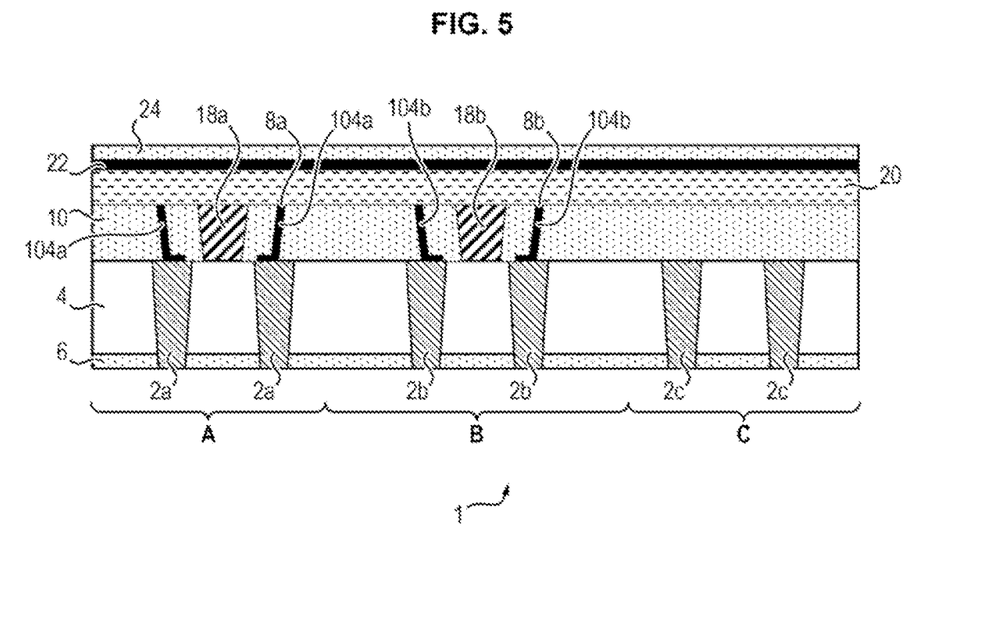
FIG. 5 shows a step of the first method for manufacturing an electronic chip according to an embodiment of the disclosure, which follows FIG. 4.

As illustrated in FIG. 5, a layer of the first material 20 is deposited on the intermediate layer 10, in contact with the lower heating connectors 104a, 104b of the first zone A and the second zone B. The first material 20 is intended to form the part of the storage elements of a first array of elementary cells, the state of which is dependent on the bit stored. More precisely, a volume of the first material 20 has either a crystalline state or an amorphous state depending on the bit stored in the storage element of which it forms part. The first material thus has appropriate characteristics to form phase change memory elements, and have in particular properties of conservation of its crystalline or amorphous state that are sufficient to ensure the storage element has long term retention (several years) of the bit that is stored therein. Preferably, the first material is a chalcogenide, and further preferably is a ternary chalcogenide compound. In particular, the first material may be made of germanium-antimony-tellurium (GeSbTe), with a majority content of germanium, greater than 60%, and preferably greater than 70%, and further preferably at least 80%.

As illustrated in FIG. 5, above the layer of the first material 20, a second conductive layer 22 is deposited, for example made of titanium nitride or titanium nitride-silicon. This second conductive layer 22 is intended to form upper conductive connectors 106a for each first elementary cell 100a, intended to enable the circulation of current through the first elementary cell 100a. A third passivation layer 24, for example made of silicon nitride, may be deposited on the second conductive layer 22.

Figure 6:
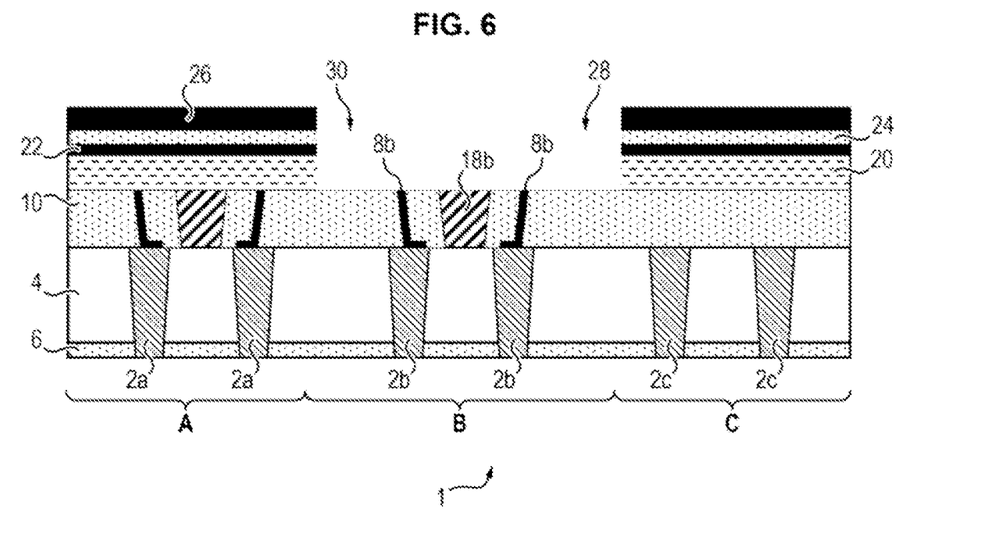
FIG. 6 shows a step of the first method for manufacturing an electronic chip according to an embodiment of the disclosure, which follows FIG. 5.

As illustrated in FIG. 6, a first etching mask 26 is then put in place. This first etching mask 26 has an opening 28 facing the second zone B, but covers the other zones A, C. The etching, at the second zone B, of the second conductive layer 22 and the layer of first material 20, as well as the passivation layer 24, is next carried out to produce an etched space 30. The etched space 30 thus uncovers the surface of the intermediate layer 10, at the second zone B, on the surface of which the lower heating connectors 104b of the second zone B are flush.

Figure 7:
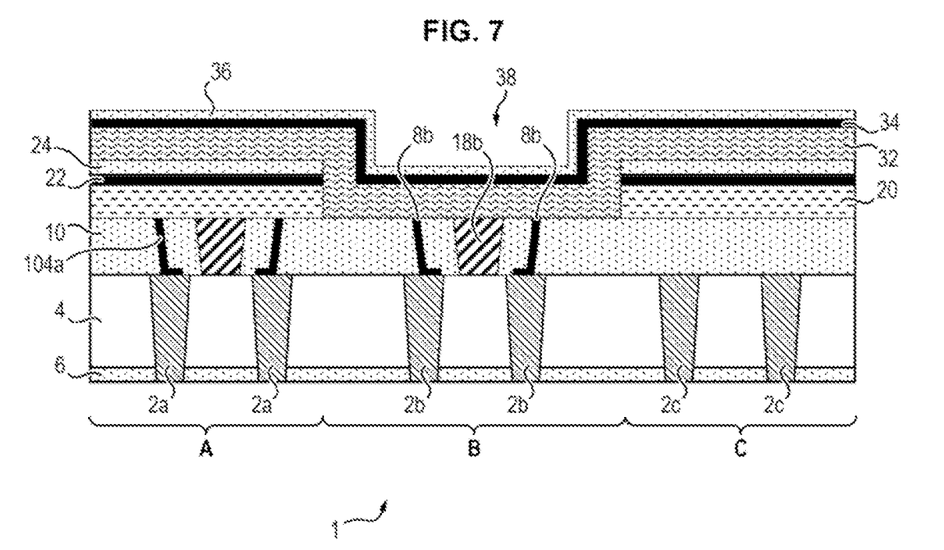
FIG. 7 shows a step of the first method for manufacturing an electronic chip according to an embodiment of the disclosure, which follows FIG. 6.

As illustrated in FIG. 7, a layer of second material 32 is next deposited, both on the etched parts (in the etched space 30) corresponding to the second zone B and the non-etched parts, corresponding at least to the first zone A, and to the third zone C. The second material 32, covering the bottom of the etched space 30, of the intermediate layer 10, is thus, in the second zone B, in contact with the lower heating connectors 104b. The second material 32 is different from the first material 20 and is intended to form the part of the storage elements of a second array of elementary cells, the state of which is dependent on the bit stored. More precisely, a volume of the second material 32 either has a crystalline state or an amorphous state depending on the bit stored in the storage element of which it forms part. The second material thus has appropriate characteristics to form phase change memory elements, and have in particular properties of change of its crystalline or amorphous state which enable the second elementary cells to have a faster access speed (reading and/or writing) than that of the first elementary cells. To do so, the second material may have a melting temperature less than that of the first material by at least 50° C., and preferably less than that of the first material by at least 80° C., and further preferably less than that of the first material by at least 120° C. The melting temperature of each material may for example be determined by the so-called "Rs(T)" method, wherein the resistance of a sample of material is measured as a function of temperature. The melting temperature corresponds to the temperature at which a sharp fall in the resistance is observed, this being attributed to the melting of the tested material.

Preferably, the second material is a chalcogenide, and further preferably is a ternary chalcogenide compound. In particular, the second material may be made of germanium-antimony-tellurium (GeSbTe), with a majority content of antimony, greater than 60%, and preferably greater than 70%, and further preferably at least 80%.

A third conductive layer 34, intended to form second upper conductors 106b, for the second elementary cells 100b, is next deposited on the layer of second material 32. A fifth passivation layer 36, for example made of silicon nitride, may be deposited on the third conductive layer 34. At the etched space 30, the layer of second material 32, the third conductive layer 34, and the fifth passivation layer 36 leave an recess 38 with respect to their levels above the first zone A and the third zone C.

Figure 8:
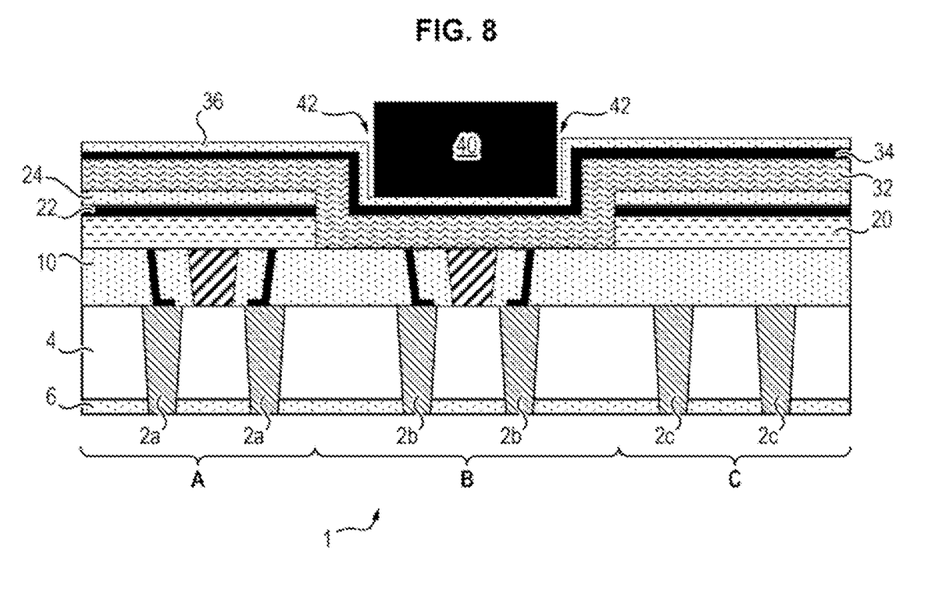
FIG. 8 shows a step of the first method for manufacturing an electronic chip according to an embodiment of the disclosure, which follows FIG. 7.

As illustrated in FIG. 8, a second etching mask 40 is next put in place. This second etching mask 40 covers a space of the second zone B which corresponds to the recess 38 that remains of the etched space 30 after the deposition of the layer of second material 32, the third conductive layer 34, and the fifth passivation layer 36. On the other hand, the second etching mask 40 leaves the first zone A and the third zone C free. It is to be noted that on account of the necessary or desired dimensional tolerances, clearances 42 are present between the part covering the etching mask 40 and the walls of the recess 38 covered by the fifth passivation layer 36.

The removal of the second material from the first zone A, and from the third zone C, is next carried out. This removal is preferably achieved by carrying out an etching in the open parts of the second etching mask 40, and notably at the first zone A. This etching makes it possible to remove the second material from the first zone A, and from the third zone C. The etching is carried out until freeing the third passivation layer 24 at the first zone A and the third zone C. Alternatively, it is possible to remove the second material from the first zone A and from the third zone C by chemical mechanical planarization (CMP).

Figure 9:
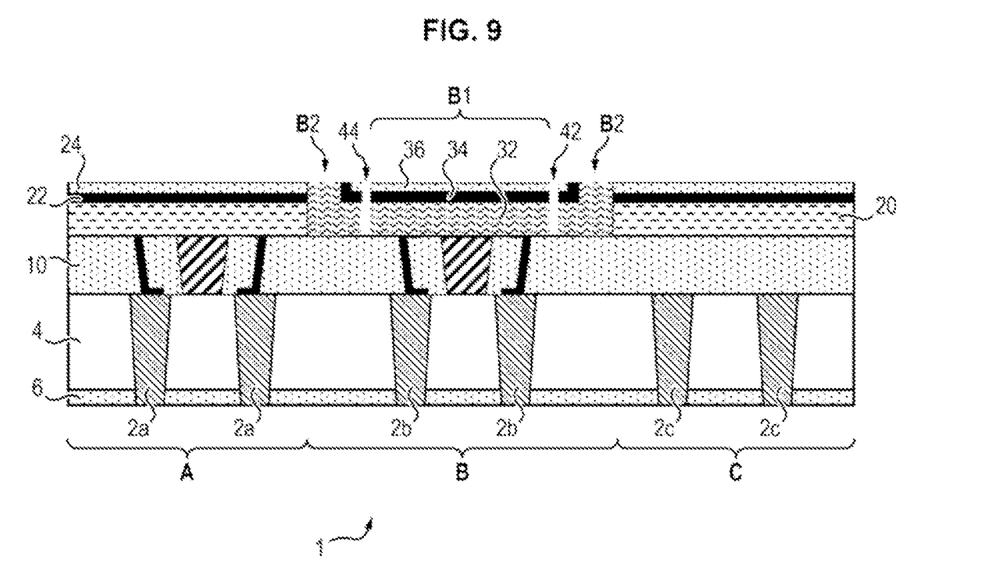
FIG. 9 shows a step of the first method for manufacturing an electronic chip according to an embodiment of the disclosure, which follows FIG. 8.

As illustrated in FIG. 9, the starter 1 then has a flat surface, formed at the first zone A and the third zone C by the third passivation layer 24 above the second conductive layer 22 and the first material 20. At the second zone B, a central part B1 of this second zone B is distinguished, which was protected by the part covering the second etching mask 40, and a peripheral part B2 of this second zone B, which was not protected by the part covering the second etching mask 40. In the central part B1 of the second zone B, the surface of the starter 1 is formed by the fifth passivation layer 36 which was under the part covering the second etching mask 40, with below the third conductive layer 34, intended to form second upper conductors 106b, and the second material 32.

The peripheral part B2 of the second zone B, not covered by the etching, corresponds to the walls of the recess 38, that is to say to the layers of the fifth passivation layer 36, the third conductive layer 34 and the second material, which have been etched and thus levelled with the third passivation layer 24. On account of the clearances 42 that were present between the part covering the etching mask 40 and the walls of the recess 38 covered by the fifth passivation layer 36, the peripheral part B2 also comprises, at its limit with the central part B1, hollows 44 resulting from the action of the etching in the clearances 42. These hollows 44 penetrate the fifth passivation layer 36, the third conductive layer 34, and may penetrate the second material 32 down to the intermediate layer 10 (as a function of the thicknesses of the layers removed by the etching and the nature thereof).

A separation etching of the first elementary cells and the second elementary cells is next carried out. This etching comprises the formation of parallel separation trenches 46a, 46b (for example by means of a resin mask) separating the lines of elementary cells of each array down to the first insulating layer 4. The separation etching thus leads to the removal of the spacers 18a, 18b and the layers above these spacers 18a, 18b. On the other hand, the layers above the lower heating connectors 104a, 104b, which extend the metal contacts 2a, 2b of the first zone A and the second zone B, are conserved. Thus, as may be seen in FIG. 10, a section of a line of an elementary cell 100a, 100b thus has, above a metal contact 2a, 2b, a volume 102a, 102b of phase change material (first material 20 for the first zone A and second material 32 for the second zone B) surrounded by a lower heating connector 104a, 104b (derived from the first conductive layer 15) and by an upper conductor 106a, 106b (derived from the second conductive layer 22 for the first zone A and the third conductive layer 34 for the second zone B).

Figure 10:
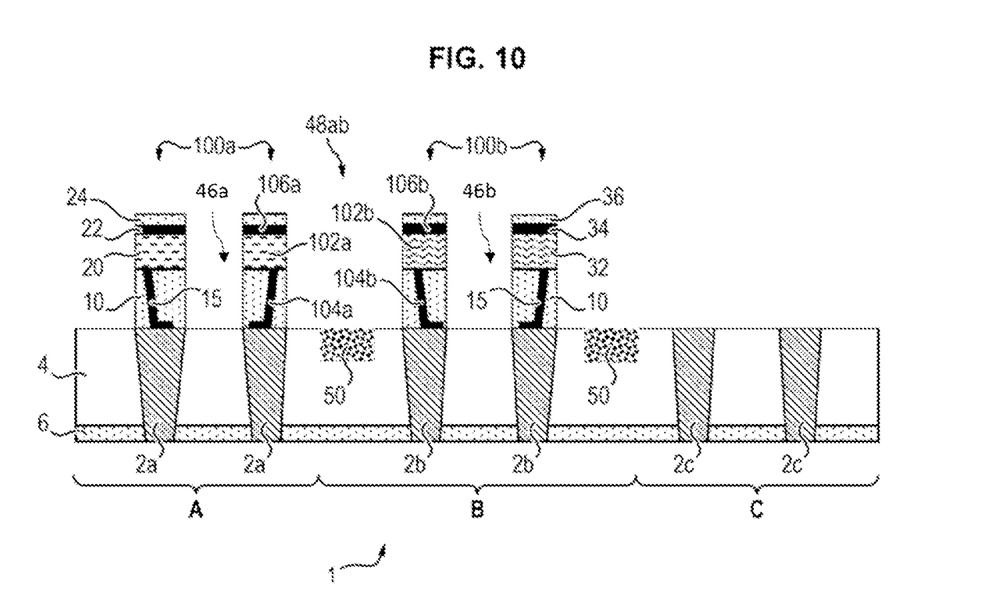
FIG. 10 shows a step of the first method for manufacturing an electronic chip according to an embodiment of the disclosure, which follows FIG. 9.

The separation etching also comprises the etching of the interfaces 48ab between the zones A, B. Following this separation etching, the lines of elementary cells are insulated from each other. The separation etching may also comprise the removal of the materials on the first insulating layer 4, outside of the zones intended to form the phase change memory arrays, such as for example for the third zone C.

It is to be noted that on account of the presence of hollows 44 in the peripheral part B2 of the second zone B that has been etched by the separation etching, the separation etching may lead to localized degradations 50 of the first insulating layer 4, facing the hollows 44. However, in so far as the clearances 42, and thus the hollows 44 resulting therefrom, are minimum since the part covering the etching mask 40 is chosen to fit as well as possible the walls of the recess 38, these localized degradations 50 extend in general over a width of less than 100 nm on the surface of the first insulating layer 4.

The arrays of elementary cells 100a, 100b are next finalized (FIG. 1). The metal contacts 2c of the third zone C traversing the first insulating layer 4 may be extended by vias 110, typically made of metal such as tungsten. An insulating layer 51, for example made of silicon dioxide, may be put in place to fill the interstices between the elementary cells 100a, 100b. A nitride layer 52 may be arranged on the insulating layer 51. The nitride layer 52 may be surmounted by an inter metal dielectric (IMD) layer, generally an oxide. It is finally possible to carry out metallization, to form conductive lines 108a, 108b, typically made of metal such as copper, to connect each elementary cell 100a, 100b.

The operation of an elementary cell 100a, 100b is as follows. A heating current circulating between the metal contact 2a, 2b and the conductive line 108a 108b, via the lower heating connector 104a, 104b, the volume 102a of first material 20 or the volume 102b of second material 60, and the upper conductor 106a, 106b, causes by Joule effect the heating at least of the lower heating connector 104a, 104b and optionally the upper conductor 106a, 106b. The temperature of the volume 102a, 102b of phase change material rises. To store a bit by an amorphous state of the volume 102a, 102b of phase change material, the temperature is raised until exceeding the melting point of this phase change material, then by rapid cooling of the volume 102a, 102b of phase change material, said material takes an amorphous state. To store a bit by a crystalline state of the volume 102a, 102b of phase change material, the temperature is raised until enabling the crystallization of the phase change material. The volume 102a, 102b of phase change material then takes a crystalline state. Reading is enabled by the difference in electrical conductivity between the crystalline state and the amorphous state.

Second Manufacturing Method

Figure 12:
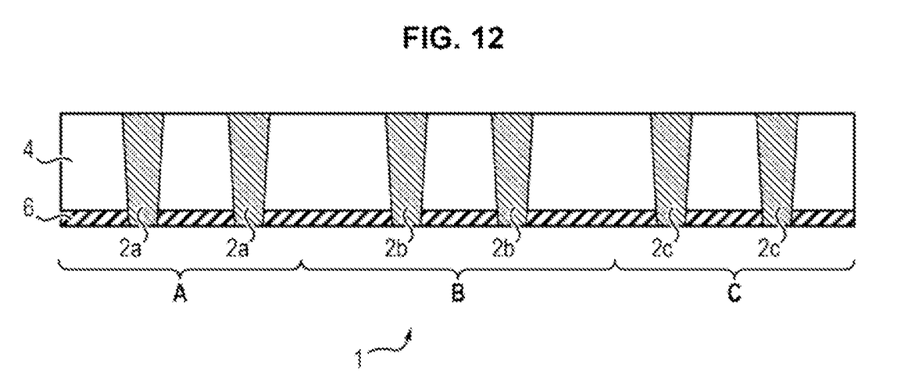
FIG. 12 shows a step of a second method for manufacturing an electronic chip according to an embodiment of the disclosure.

With reference to FIGS. 12 to 18, another manufacturing method will now be described which makes it possible to obtain the electronic chip of FIG. 11. As previously, a first step of the method comprises providing a starter 1 of an electronic chip from a front end of line (FEOL) portion, which is illustrated by FIG. 12. In order to simplify the description, only the parts of the manufacture corresponding to the manufacture of the first array of elementary cells and the second array of elementary cells forming two types of phase change memory will be dealt with here. The other parts (processors, other memories, etc.) are neither represented in the figures, nor detailed herein, even though they are also present during manufacture.

In the present case, the starter 1 thus has on the surface of a substrate devices such as transistors and selectors which form a part of the logic of the memories. This part is not represented in the figures, in so far as it involves a part known to those skilled in the art, not impacted by the disclosure. Preferably, the substrate is formed of silicon on insulator. The starter 1 comprises a plurality of metal contacts 2a, 2b, 2c (for example made of tungsten) traversing a first insulating layer 4, for example made of silicon dioxide, which may be formed on the surface of a passivation layer 6, for example made of silicon nitride.

The electronic chip, and thus its starter 1, may be divided into several spatial zones each corresponding to emplacements where components of the chip are intended to be produced. In the example illustrated, a first zone A of the electronic chip corresponds to the first elementary cells to produce, a second zone B corresponds to the second elementary cells to produce, and a third zone C corresponds to connections between the levels of the electronic chip. For reasons of simplification, the first zone A is shown adjacent to the second zone B. Other zones could however separate them. In addition, there could be several first zones A and several second zones B therein, each intended to receive a memory array. The third zone C is present to show an example of compatibility of the manufacturing method with the production of other components, but this third zone C and its characteristics are optional, and will sometimes be omitted in the description.

The metal contacts 2a, 2b, 2c are regularly spread out in the first insulating layer 4 and traverse both the first insulating layer 4 and the first passivation layer 6. The metal contacts 2a, 2b, 2c are flush on the surface of the first insulating layer 4. In order to simplify things, only two metal contacts 2a, 2b, 2c per zone are illustrated in the sections appearing in the figures, but it is obvious that in reality much more (sometimes hundreds and more generally thousands) of metal contacts 2a, 2b are aligned at least for the first zone A and the second zone B, since each array of elementary cells typically comprises several thousands or millions of elementary cells.

On the starter 1 of the electronic chip, and notably on the first insulating layer 4, are produced lower heating connectors 104a traversing a passivation layer, preferably made of silicon nitride, to connect at least the metal contacts 2a of the first zone A, but not the metal contacts 2b of the second zone B.

Figure 13:
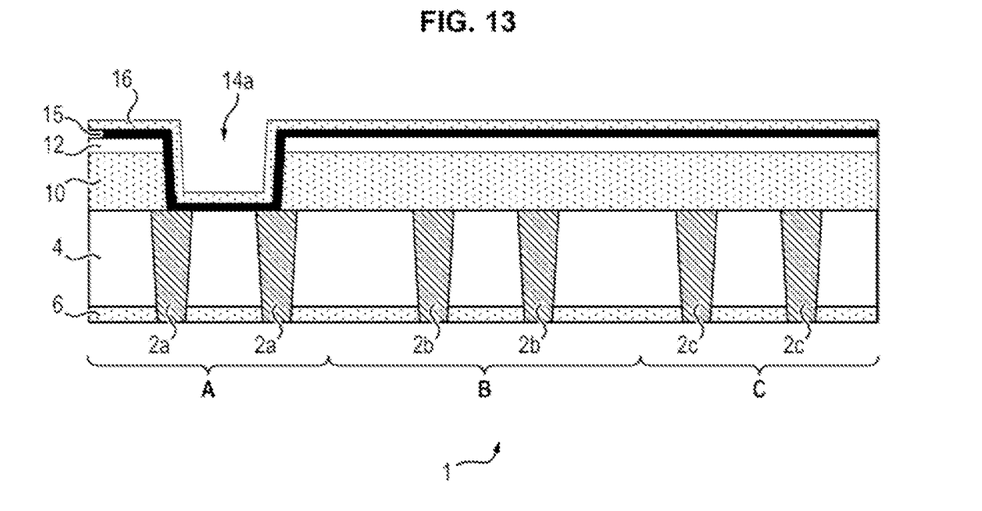
FIG. 13 shows a step of the second method for manufacturing an electronic chip according to an embodiment of the disclosure, which follows FIG. 12.

To do so, as illustrated in FIG. 13, an intermediate layer 10, preferably made of silicon nitride, is arranged on the surface of the first insulating layer 4, covering the metal contacts 2a, 2b, 2c which are flush therewith. A second insulating layer 12, typically made of silicon dioxide, is next deposited on the intermediate layer 10. By means of an initial etching mask having an opening at the first zone A, trenches 14a are arranged by etching down to reach the first insulating layer 4 and to free at least partially each metal contact 2a, of the first zone A. On the other hand, the metal contacts 2b of the second zone B are not freed. In the example illustrated, each trench 14a straddles two metal contacts 2a, and thus makes it possible to free two metal contacts 2a at the same time. Preferably, the walls of the trenches 14a are above the metal contacts 2a of the first zone A.

A first conductive layer 15 is next deposited, for example made of titanium nitride or titanium nitride-silicon. This first conductive layer 15 is intended to form lower heating conductors 104a for the first elementary cells 100a. Like the other layers, this first conductive layer 15 covers the whole of the starter 1, and thus covers the second insulating layer 12 for the non-etched zones (second zone A and third zone C), and for the etched zones (first zone A) covers the first insulating layer 4 on the surface of which the metal contacts 2a of the first zone A are flush, in the trenches 14a. On this first conductive layer 15 may be deposited a second passivation layer 16, for example made of silicon nitride. When the walls of the trenches 14a are above the metal contacts 2a, the conductive layer 15 that covers them also stands above the metal contacts 2a of the first zone A.

As explained previously with reference to FIGS. 3 and 4, insulating spacers 18a are formed in the trenches 14a, between adjacent lower heating connectors 104a formed from the first conductive layer 15, right above two adjacent metal contacts 2a. However, only the first zone A is here concerned. To do so, for example an etching is carried out to remove the second passivation layer 16 at least in the trenches 14a. An additional deposition of silicon nitride may take place, then another etching at least in the trenches 14a. Thus, the conductive layer 15 on the surface of the first insulating layer 4 between two adjacent metal contacts 2a is removed. Insulating spacers 18a, for example made of silicon dioxide $SiO_2$, may next be arranged to fill the spaces thus freed of the trenches 14a.

Figure 14:
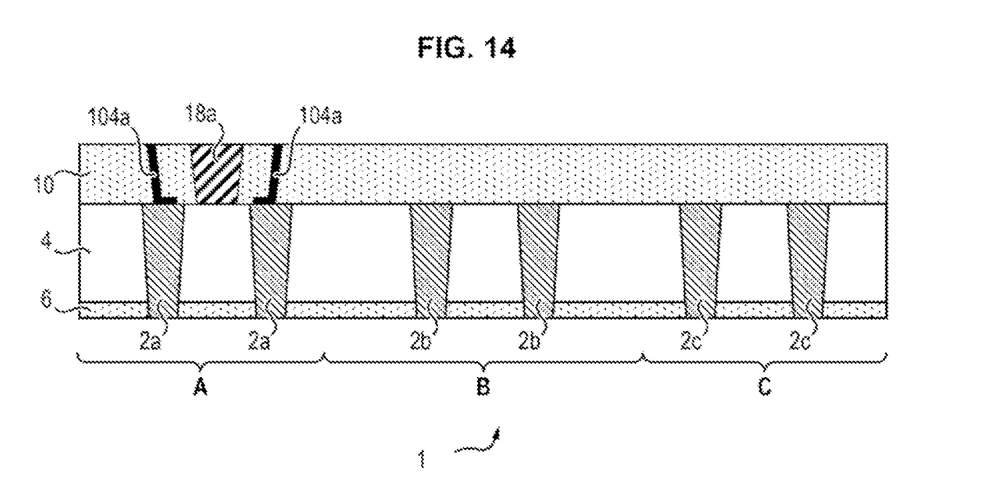
FIG. 14 shows a step of the second method for manufacturing an electronic chip according to an embodiment of the disclosure, which follows FIG. 13.

The parts above the intermediate layer 10 are next removed to flatten the starter 1, for example by chemical mechanical planarization, at the surface of the intermediate layer 10. Whereas the second insulating layer 12 is thus entirely removed, the parts of the conductive layer 15 and the second passivation layer 16 which penetrate into the trenches 14a below the surface of the first insulating layer 4, are conserved, as well as the spacers 18a. The starter 1 of FIG. 14 is then obtained. The conserved parts of the conductive layer 15 are intended to form the lower heating connectors 104a, and spacers 18a are interposed between adjacent lower heating connectors 104a of the first zone A.

Figure 15:
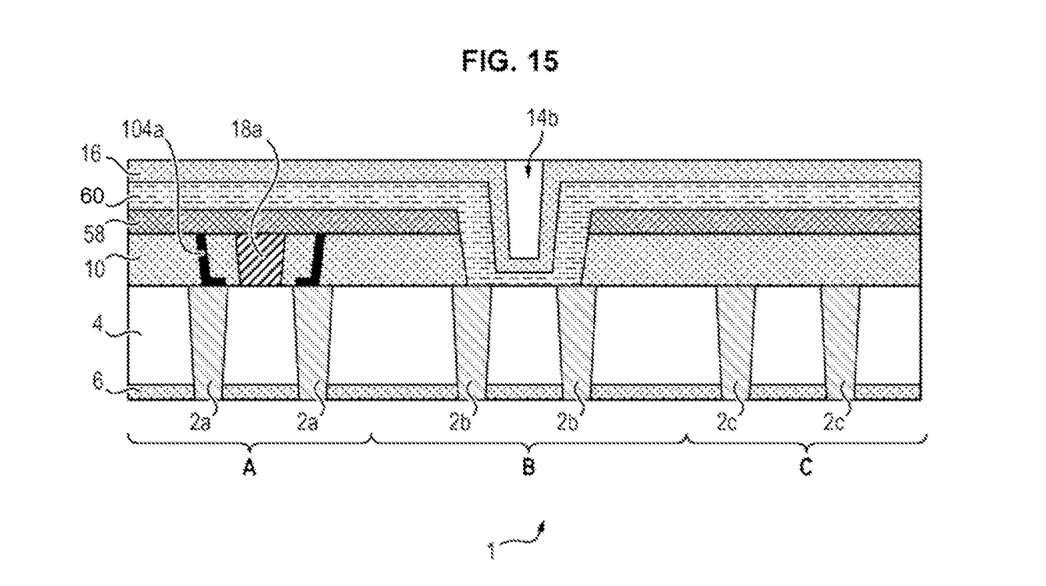
FIG. 15 shows a step of the second method for manufacturing an electronic chip according to an embodiment of the disclosure, which follows FIG. 14.

As illustrated in FIG. 15, an insulating layer 58, preferably made of silicon oxide, is arranged on the surface of the intermediate layer 10. By means of a first etching mask having an opening uncovering the second zone B, trenches 14b are arranged by etching down to reach the first insulating layer 4 and to free at least partially each metal contact 2b of the second zone B. This step is similar to that of FIG. 6, except in that the etching here reaches the metal contacts 2b of the second zone B. On the other hand, the metal contacts 2a of the first zone A are not freed. In the example illustrated, each trench 14b straddles two metal contacts 2b, and thus makes it possible to free two metal contacts 2b at the same time. Preferably, the walls of the trenches 14b are above the metal contacts 2b of the second zone B.

A layer of second material 60 is next deposited, both in the trenches 14b corresponding to the second zone B and on the non-etched parts of the insulating layer 58, corresponding at least to the first zone A, and to the third zone C. The second material 60, covering the bottom of the trenches 14b, is thus in contact with the first insulating layer 4 on the surface of which the metal contacts 2b of the first zone B are flush. When the walls of the trenches 14b are above the metal contacts 2b of the second zone B, the layer of second material 60 that covers it also stands above these metal contacts 2b. A second passivation layer 16, for example made of silicon nitride, may be deposited on the layer of second material 60.

The second material 60 is intended to form the part of the storage elements of a second array of elementary cells, the state of which is dependent on the bit stored. More precisely, a volume of the second material 60 has either a crystalline state or an amorphous state depending on the bit stored in the storage element of which it forms part. The second material 60 thus has appropriate characteristics to form phase change memory elements. Preferably, the second material is a chalcogenide, and further preferably is a ternary chalcogenide compound. In particular, the second material may be made of germanium-antimony-tellurium (GeSbTe), with a majority content of antimony, greater than 60%, and preferably greater than 70%, and further preferably at least 80%.

An etching is next carried out in the trenches 14b, removing the passivation layer 58 and the layer of second material 60 on the surface of the first insulating layer 4 between two adjacent metal contacts 2b. Insulating spacers 18b, for example made of silicon dioxide SiO$_2$, may next be arranged in the spaces thus freed of the trenches 14b. The trenches 14b may next be filled with an insulator, for example silicon dioxide.

Figure 16:
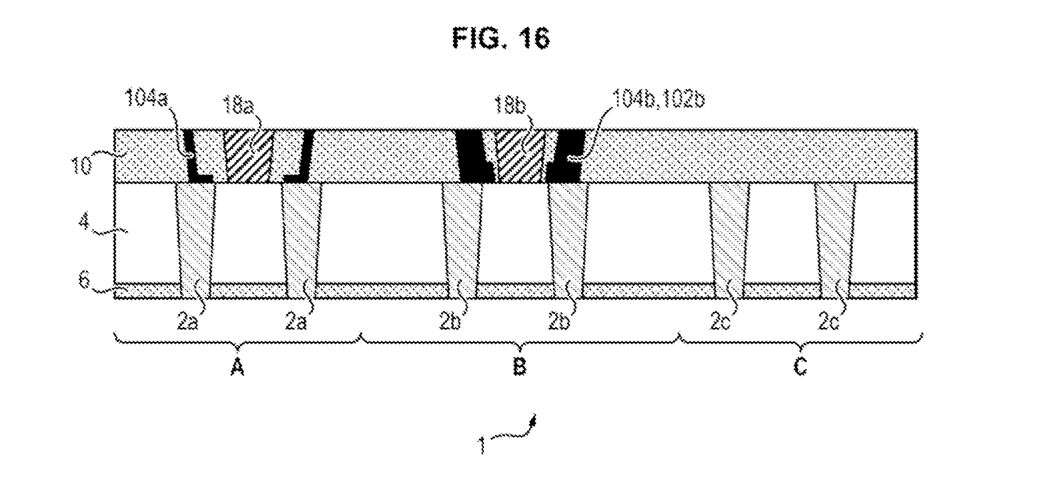
FIG. 16 shows a step of the second method for manufacturing an electronic chip according to an embodiment of the disclosure, which follows FIG. 12.

The removal of the second material from the first zone A is next carried out to free the intermediate layer 10. The parts above the intermediate layer 10 are thus removed to smooth out the starter 1, for example by chemical mechanical planarization, at the surface of the intermediate layer 10. Whereas the insulating layer 58 is thus entirely removed, the parts of the layer of second material 60 and the second passivation layer 16 which penetrate into the trenches 14b below the surface of the intermediate layer 10, are conserved, as well as the spacers 18b. The starter 1 of FIG. 16 is then obtained. The conserved parts of the second material 60 form both the lower heating connectors 104b and the volume of phase change material having either a crystalline state or an amorphous state depending on the bit stored.

Figure 17:
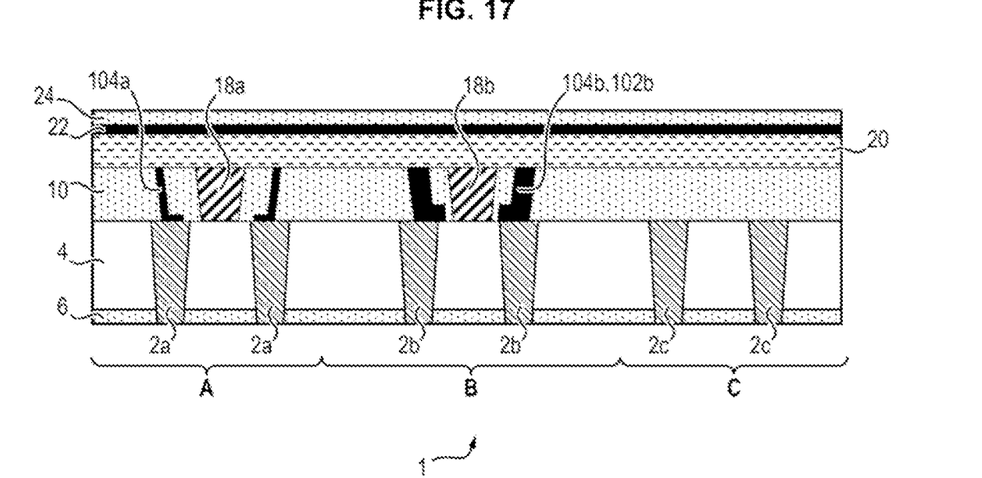
FIG. 17 shows a step of the second method for manufacturing an electronic chip according to an embodiment of the disclosure, which follows FIG. 16.

As illustrated in FIG. 17, a layer of the first phase change material 20 is deposited on the intermediate layer 10 at the first zone A and the second zone B. The layer of first material 20 is in contact with the lower heating connectors 104a, 104b of the first zone A and the second zone B. The first material is intended to form the part of the storage elements of a first array of elementary cells, the state of which is dependent on the bit stored. More precisely, a volume of the first material either has a crystalline state or an amorphous state depending on the bit stored in the storage element of which it forms part. The first material thus has appropriate characteristics to form phase change memory elements, and have in particular properties of conservation of its crystalline or amorphous state that are sufficient to ensure for the storage element a long term retention (several years) of the bit that is stored therein. Notably, this retention is better than that of the second storage elements formed by the second material. To do so, the first material may have a melting temperature greater than that of the second material by at least 50° C., and preferably greater than that of the second material by at least 80° C., and further preferably greater than that of the second material by at least 120° C. The melting temperature of each material may for example be determined by the so-called "Rs(T)" method, wherein the resistance of a sample of material is measured as a function of temperature. The melting temperature corresponds to the temperature at which a sharp fall in the resistance is observed, this being attributed to the melting of the tested material.

Preferably, the first material is a chalcogenide, and further preferably is a ternary chalcogenide compound. In particular, the first material may be made of germanium-antimony-tellurium (GeSbTe), with a majority content of germanium, greater than 60%, and preferably greater than 70%, and further preferably at least 80%.

As illustrated in FIG. 17, above the layer of the first material 20, a second conductive layer 22 is deposited, for example made of titanium nitride or titanium nitride-silicon. This second conductive layer 22 is intended to form upper conductors 106a, 106b for the storage elements of the first zone A and the second zone B. A third passivation layer 24, for example made of silicon nitride, may be deposited on the second conductive layer 22.

Figure 18:
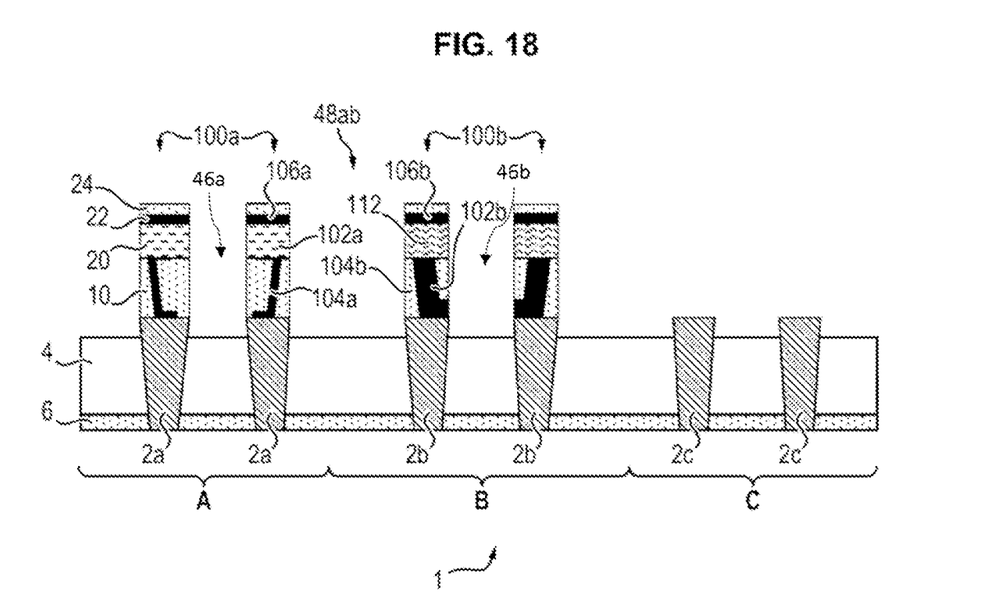
FIG. 18 shows a step of the second method for manufacturing an electronic chip according to an embodiment of the disclosure, which follows FIG. 17.

A separation etching of the first elementary cells 100a and the second elementary cells 100b is next carried out. This etching comprises the formation of parallel separation trenches 46a, 46b (for example by photolithography) separating the lines of elementary cells 100a, 100b of each array down to the first insulating layer 4. The separation etching thus leads to the removal of the spacers 18a, 18b and the layers above these spacers 18a, 18b. On the other hand, the layers above the lower heating connectors 104a, 104b, which extend the metal contacts 2a, 2b of the first zone A and the second zone B, are conserved.

Thus, as may be seen in FIG. 18, a section of a first elementary cell 100a, thus has above a metal contact 2a, a volume 102a of first phase change material 20 surrounded by a lower heating connector 104a (derived from the first conductive layer 15) and by an upper conductor 106a (derived from the second conductive layer 22). A section of a second elementary cell 100b has above a metal contact 2b, a volume 102b of second phase change material 60 also forming a lower heating connector 104b. Above this volume 102b of second phase change material 60 lies a volume 112b of first phase change material 20, and an upper conductor 106b (derived from the second conductive layer 22).

The separation etching also comprises etching of the interfaces 48ab between the zones A, B. Following this separation etching, the lines of elementary cells 100a, 100b are insulated from each other. The separation etching may also comprise the removal of the materials on the first insulating layer 4, outside of the zones intended to form the arrays of phase change memory, such as for example for the third zone C.

The arrays of elementary cells 100a, 100b are next finalized (FIG. 11). The metal contacts 2c of the third zone C traversing the first insulating layer 4 may be extended by vias 110, typically made of metal such as tungsten. An insulating layer 51, for example made of silicon dioxide, may be put in place to fill the interstices between the elementary cells 100a, 100b. A nitride layer 52 may be arranged on the insulating layer 51. The nitride layer 52 may be surmounted by an inter metal dielectric (IMD) layer, generally an oxide. It is finally possible to carry out a metallization, to form conductive lines 108a, 108b, typically made of metal such as copper, to connect each elementary cell 100a, 100b.

The operation of a first elementary cell 100a is as follows. A current circulating between the metal contact 2a and the conductive line 108a, via the lower heating connector 104a, the volume 102a of first material 20 and the upper conductor 106a, causes by Joule effect the heating at least of the lower heating connector 104a, and optionally the upper conductor 106a. The temperature of the volume 102a of first material 20 rises. To store a bit by an amorphous state of the volume 102a of first material 20, the temperature is raised until exceeding the melting point of this first material 20, then by rapid cooling of the volume 102a of first material 20, said material takes an amorphous state. To store a bit by a crystalline state of the volume 102a of first material 20, the temperature is raised until enabling the crystallization of the first material, but remains below the melting point of this first material 20. The volume 102a of first material 20 then takes a crystalline state. Reading is enabled by the difference in conductivity between the crystalline state and the amorphous state.

The operation of a second elementary cell 100b is as follows. A current circulating between the metal contact 2b and the conductive line 108b, via the volume 102b of second material 60, the volume 112 of first material 20 and the upper conductor 106b, causes by Joule effect the heating of the volume 102b of second material 60, and optionally the upper conductor 106b. The temperature of the volume 102b of second material 60 rises. To store a bit by an amorphous state of the volume 102b of first material 60, the temperature is raised until exceeding the melting point of this second material 60, then by rapid cooling of the volume 102b of second material 60, said material takes an amorphous state. Preferably, the temperature does not exceed the melting point of the first material 20 (which is greater than that of the second material 60). To store a bit by a crystalline state of the volume 102b of second material 60, the temperature is raised until enabling the crystallization of the second material, but remains below the melting point of this second material 60. The volume 102b of second material 60 then takes a crystalline state. Reading is enabled by the difference in conductivity between the crystalline state and the amorphous state.

The disclosure is not limited to the embodiment described and represented in the appended figures. Modifications remain possible, notably from the point of view of the constitution of the various technical characteristics or by substitution of technical equivalents, without however going beyond the protection domain of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming a plurality of lower heating connectors on a first insulating layer, a plurality of metal contacts traversing the first insulating layer, a first zone of the electronic chip corresponding to first elementary cells and a second zone of the electronic chip corresponding to second elementary cells, wherein the lower heating connectors extend through an intermediate layer and connect to at least the metal contacts of the first zone, spacers being interposed between adjacent lower heating connectors;
    forming a first phase change material on the intermediate layer and in contact with the lower heating connectors;
    forming upper conductors over the first phase change material by the deposition of a conductive layer;
    forming at least one cavity extending through the conductive layer and the first phase change material in the second zone, using a first etching mask having an opening facing the second zone;
    forming a second phase change material in the at least one cavity in the second zone;
    forming a second insulating layer between the first elementary cells and the second elementary cells; and
    forming conductive lines connecting the upper conductors of the first elementary cells and the second elementary cells.

2. The method according to claim 1, comprising:
    forming the second phase change material at the first zone and the second zone, the second phase change material being, in the second zone, in contact with the lower heating connectors;
    forming a second conductive layer on the second phase change material, the second conductive layer forming upper connectors for the second elementary cells; and
    putting in place a second etching mask covering a space of the second zone and leaving free the first zone, and removing the second phase change material from the first zone.

3. The method according to claim 1, wherein the forming the lower heating connectors includes forming the lower heating connectors in contact with the metal contacts of the first zone and the second zone.

4. The method according to claim 1, comprising:
    putting in place the first etching mask having an opening uncovering the second zone, and etching the intermediate layer down to the first insulating layer;
    forming the second phase change material in contact with metal contacts of the second zone;
    removing the second phase change material from the first zone to free the intermediate layer; and
    forming the first phase change material at the first zone and the second zone and depositing the conductive layer on the first material, the conductive layer forming upper conductors.

5. The method according to claim 1, wherein the forming the lower heating connectors includes forming the lower heating connectors in contact with the metal contacts of the first zone only.

6. The method according to claim 1, wherein the second phase change material has a melting temperature that is at least 50° C. less than a melting temperature of the first phase change material.

7. A method, comprising:
    forming a first conductor;
    forming a first L-shaped heating connector over the first conductor, the first heating connector including a first phase change material;
    forming a first layer of second phase change material over the first heating connector, the second phase change material different from the first phase change material;
    forming a first upper heating connector over the first layer of the second phase change material;
    forming a second conductor;
    forming a second L-shaped heating connector over the second conductor, the second heating connector including a conductive material;
    forming a second layer of the second phase change material over the second conductor; and
    forming a second upper heating connector over the second layer of the second phase change material.

8. The method according to claim 7, comprising forming a passivation layer over the first upper heating connector and the second upper heating connector.

9. The method according to claim 7, wherein forming the L-shaped first and second heating connectors includes forming an angle that is greater than 90°.

10. The method according to claim 7, wherein forming the second phase change material has a melting temperature that is at least 50° C. less than a melting temperature of the first phase change material.

11. A method, comprising:
forming a first array of first elementary cells and a second array of second elementary cells wherein:
forming the first array of first elementary cells includes forming a first type of phase change material and the second array of second elementary cells includes a second type of phase change material that is different from the first type;
forming a storage element by a volume of phase change material;
forming a volume of a first phase change material in each first elementary cell;
forming a volume of a second phase change material in each second elementary cell, different from the first phase change material;
forming a contact in each first elementary cell and second elementary cell; and
forming a heating connector in each first elementary cell and second elementary cell, the heating connectors of each first and second elementary cell are L-shaped with an angle greater than 90° and coupled to both the contact and a respective volume of first and second phase change material.

12. The method of claim 11, wherein the second phase change material has a melting temperature that is at least 50° C. less than a melting temperature of the first phase change material.

13. The method of claim 11, wherein the second phase change material has a melting temperature that is at least 120° C. less than the melting temperature of the first phase change material.

14. The method of claim 11, wherein the first phase change material and the second phase change material are chalcogenides.

15. The method of claim 11, wherein the first phase change material and the second phase change material are made of germanium-antimony-tellurium, the first phase change material having a germanium content at least three times greater than that of the second phase change material, and the second phase change material having an antimony content at least three times greater than that of the first phase change material.

16. The method of claim 11, wherein the first phase change material includes germanium-antimony-tellurium with a germanium content greater than 60%, and the second phase change material includes germanium-antimony-tellurium with an antimony content greater than 60%.

17. The method of claim 11, wherein the storage element of each first elementary cell includes the volume of the first phase change material, and the storage element of each second elementary cell includes the volume of the second phase change material.

* * * * *